United States Patent
Calmes

(10) Patent No.: US 11,742,790 B2
(45) Date of Patent: Aug. 29, 2023

(54) TEMPERATURE DETECTION OF A TRANSISTOR

(71) Applicant: NXP USA, INC., Austin, TX (US)

(72) Inventor: Pierre Philippe Calmes, Toulouse (FR)

(73) Assignee: NXP USA, INC., Austin, TX (US)

( * ) Notice: Subject to any disclaimer, the term of this patent is extended or adjusted under 35 U.S.C. 154(b) by 18 days.

(21) Appl. No.: 17/648,991

(22) Filed: Jan. 26, 2022

(65) Prior Publication Data
US 2023/0188080 A1   Jun. 15, 2023

(30) Foreign Application Priority Data

Dec. 10, 2021 (EP) .................................... 21306737

(51) Int. Cl.
| | |
|---|---|
| H02P 29/02 | (2016.01) |
| H02P 27/08 | (2006.01) |
| H02P 29/024 | (2016.01) |
| G01K 7/00 | (2006.01) |
| G01R 19/165 | (2006.01) |

(52) U.S. Cl.
CPC .............. *H02P 29/027* (2013.01); *G01K 7/00* (2013.01); *G01R 19/16571* (2013.01); *G01K 2219/00* (2013.01)

(58) Field of Classification Search
CPC .......... H02P 29/02; H02P 27/08; H02P 6/085; H02P 29/032; G01R 19/165; G01K 7/006
See application file for complete search history.

(56) References Cited

U.S. PATENT DOCUMENTS

| | | | |
|---|---|---|---|
| 7,224,135 B1* | 5/2007 | Menegoli | H02P 25/034 |
| | | | 318/434 |
| 7,554,300 B2* | 6/2009 | Furukawa | B60L 58/25 |
| | | | 361/103 |
| 8,059,377 B2* | 11/2011 | Ikeuchi | H02J 7/00304 |
| | | | 361/87 |
| 10,389,263 B2 | 8/2019 | Baumann et al. | |
| 10,715,132 B2* | 7/2020 | Takayama | H02P 27/06 |
| 10,903,355 B1* | 1/2021 | Strzalkowski | H03K 17/145 |
| 11,057,029 B2* | 7/2021 | Westwick | H03K 17/168 |
| 11,362,646 B1* | 6/2022 | Tesu | H03K 17/567 |
| 11,569,798 B2* | 1/2023 | Krug | H03K 3/011 |
| 2019/0341917 A1* | 11/2019 | Li | H03K 17/0828 |

OTHER PUBLICATIONS

Dang, D., "Temperature Dependency of Silicon Carbide MOSFET on-Resistance Characterization and Modeling", Materials Science Forum, vol. 963, https://doi.org/10.4028/www.scientific.net/MSF.963.592, Jul. 2019.

* cited by examiner

*Primary Examiner* — Thai T Dinh

(57) ABSTRACT

The internal temperate of a transistor is determined by detecting a voltage though a terminal of an integrated circuit that is also used by an overcurrent detection circuit of the integrated circuit for detecting an overcurrent condition of the system. The overcurrent detection circuit is coupled to a current electrode of the transistor through the terminal of the integrated circuit. A determination of internal temperature is based on a voltage measurement taken from the terminal during an on phase of the transistor. The voltage measurement is converted to a digital value and is used to determine an internal temperature of the transistor.

20 Claims, 4 Drawing Sheets

TEMPERATURE DETECTION OF A TRANSISTOR

BACKGROUND OF THE INVENTION

Field of the Invention

This invention relates to temperature detection of a transistor.

Background

Transistors are used in many types of electronic circuits. Some types of transistors such as silicon carbide (SiC) field effect transistors (FETs), insulated gate bipolar transistors (IGBTs), and laterally diffused MOSFETs (LDMOSFETs) can be utilized in high voltage or high power applications such as in variable-frequency drives (VFDs), electric cars, trains, variable-speed refrigerators, lamp ballasts, arc-welding machines, transmitters, and air conditioners.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of at least one mode for carrying out the invention. The description is intended to be illustrative of the invention and should not be taken to be limiting.

Disclosed herein are systems, circuitry, and methods for determining the internal temperature of a transistor. In some embodiments, the internal temperate of a transistor is determined by detecting a voltage though a terminal of an integrated circuit that is also used by an overcurrent detection circuit of the integrated circuit for detecting an overcurrent condition of the system. The overcurrent detection circuit is coupled to a current electrode of the transistor through the terminal of the integrated circuit. A determination of internal temperature is based on a voltage measurement taken from the terminal during an on phase of the transistor. The voltage measurement is converted to a digital value and is used to determine an internal temperature of the transistor.

In some embodiments, utilizing a terminal of an integrated circuit that is used to monitor an overcurrent condition to obtain a voltage of the terminal that can be used to determine internal temperature may provide for a system that requires less terminals and less external devices for determining an internal temperature of a transistor.

Figure 1:
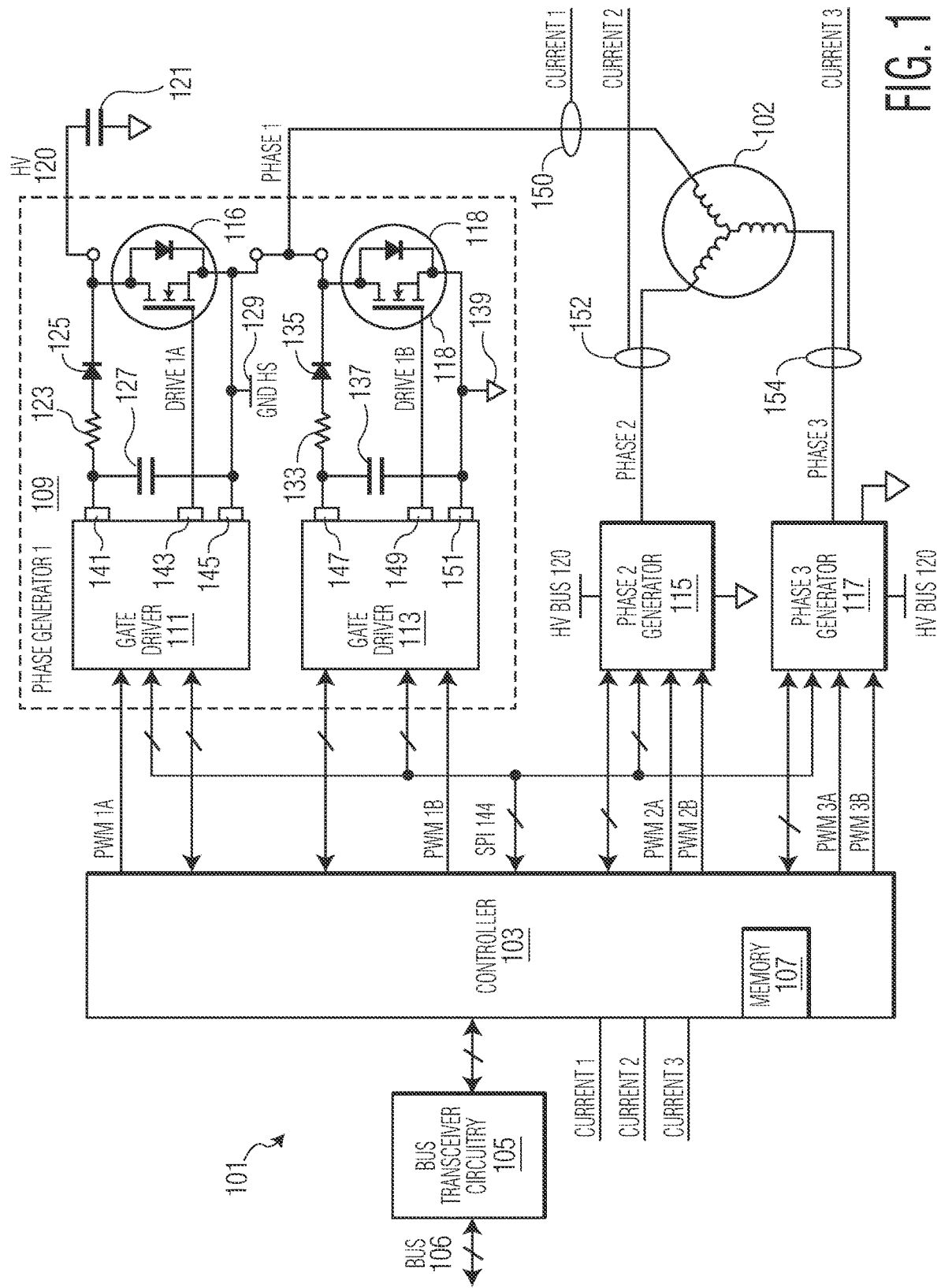
FIG. 1 is a circuit diagram of a motor control system and electric motor according to one embodiment of the present invention.

FIG. 1 is a circuit diagram of motor control system 101 and electric motor 102 according to one embodiment of the present invention. System 101 produces three, phase drive signals (PHASE 1, PHASE 2, PHASE 3) that are provided to the three phase terminals of electric motor 102 for powering motor 102 and for controlling its speed. Each phase drive signal is provided by a phase generator 109, 115, 117. In one embodiment, each phase signal is an emulated sinusoidal signal that is 120 degrees out of phase with the other two phase drive signals. In one embodiment, motor 102 is a three phase induction motor that is used in an electric vehicle for propelling the vehicle. However, in other embodiments, motor 102 may be another type of motor and/or be used in other applications such as in industrial, commercial, or residential applications. In other embodiments, control system 101 may control the operation of motor 102 in other ways.

Each phase drive generator (109, 115, and 117) includes two high voltage transistors (a high side transistor and a low side transistor) with transistors 116 and 118 being shown for phase generator 109. In the embodiment shown, transistors 116 and 118 are silicon carbide (SiC) transistors. But in other embodiments, transistors 116 and 118 may be other types of transistors such as IGBTs or LDMOS transistors. High side transistor 116 includes a drain connected high voltage bus 120 and a source connected to the PHASE 1 signal line. Low side transistor 118 includes a drain connected to the PHASE 1 signal line and a source connected to system ground 139. In one embodiment, high voltage bus 120 is biased at a voltage of 400 or 800 volts, but may be biased at other voltages.

The gate of transistor 116 is controlled by a drive signal (DRIVE 1A) from terminal 143 of gate driver 111 and the gate of transistor 118 is controlled by a drive signal (DRIVE 1B) from terminal 149 of gate driver 113. Drive signals (DRIVE 1A and DRIVE 1B) are pulse width modulated signals that make their corresponding transistors conductive when they are at a high voltage state and nonconductive when they are at a low voltage state. Drive signals DRIVE 1A and DRIVE 1B are generally inverse to each other to where both transistors 116 and 118 are not on at the same time. In one embodiment, gate drivers 111 and 113 are each implemented in a separate integrated circuit. Although in some embodiments, they may be implemented in one integrated circuit or in multiple integrated circuits.

When transistor 116 is conductive, current flows from the high voltage rail (HV bus 120) to the PHASE 1 signal line to raise the voltage of the PHASE 1 signal line. When transistor 118 is conductive, current flows from the PHASE 1 signal line to ground 139 to lower the voltage of the PHASE 1 signal line. During operation, gate drivers 111 and 113 control the drive signals DRIVE 1A and DRIVE 1B to make transistors 116 and 118 conductive such that the voltage of the PHASE 1 signal line generally emulates a sinusoidal signal that ranges between the voltage of HV bus 120 and ground 139 at a frequency equal to the desired RPM of motor 102. The voltages produced on the PHASE 2 and PHASE 3 signal lines are the same but are 120 degrees out of phase with each other and with the voltage of the PHASE 1 signal line. System 101 controls the speed of motor 102 by controlling the frequency of the phase drive signals.

Gate driver 111 includes terminal 141 that is coupled to the drain of transistor 116 through a resistor 123 and diode 125. Gate driver 111 includes terminal 145 that is coupled to the source of transistor 116 and a high voltage ground 129 (GND HV). Capacitor 127 is connected to terminals 141 and 145.

Gate driver 113 includes terminal 147 that is coupled to the drain of transistor 118 through a resistor 133 and diode 135. Gate driver 113 includes terminal 151 that is coupled to the source of transistor 118 and ground 139. Capacitor 137 is connected to terminals 147 and 151. Phase generators 115 and 117 are configured similarly.

Controller 103 controls the speed of motor 102 by providing pulse width modulated control signals (PWM 1A, PWM 1B, PWM 2A, PWM 2B, PWM 3A, and PWM 3B) to the gate drivers of phase generators 109, 115, and 117 which control the timing of the drive signals (DRIVE 1A, DRIVE 1B) of the phase generators. PWM control signal PWM1A is provided to gate driver 111 to control the timing of drive signal DRIVE 1A and PWM control signal PWM1B is provided to gate driver 113 to control the timing of the DRIVE 1B signal. In one embodiment, controller 103 is implemented in an integrated circuit, but may be implemented in multiple integrated circuits in other embodiments.

System 101 includes bus transceiver circuitry 105 that enables system 101 to communicate with other systems via a bus 106. In one embodiment, bus 106 provides data via a CAN protocol, but bus 106 may conform to other communication protocols in other embodiments. In some embodiments, circuitry 105 may communicate some signals with phase generators 109, 115, and 117.

Controller 103 exchanges digital data with the phase generators 109, 115, and 117 via a parallel digital data bus (SPI bus 144). As will be discuss later, each gate driver (111 and 113) of the phase generators 109, 115, and 117 provides digital voltage information indicative of the voltage of a terminal (e.g., 147) coupled to a drain of a transistor (e.g., 118) during an on time of the transistor. Controller 103 uses that voltage information to determine an internal temperature of the transistor. In one embodiment, the code and other information that controller 103 uses to determine the internal temperature is stored in memory 107. If any of the six transistors (e.g., 116 and 118) of generators 109, 115, and 117 has an internal temperature that exceeds a particular threshold, controller 103 (or any of the gate drivers) can initiate a shutdown of motor 102. System 101 also includes other signal lines between controller 103 and phase generators 109, 115, and 117.

System 101 includes current sensors 150, 152, and 154 for measuring the current of phase signal lines PHASE 1, PHASE 2, and PHASE 3, respectively. The current measurements from sensors 150, 152, and 154 are provided via lines CURRENT 1, CURRENT 2, and CURRENT 3, respectively, to controller 103. Controller 103 includes analog to digital circuitry (not shown) for converting the current measurements to digital values. The digital values of the phase signal lines are generated when the high side transistors (116) are conductive and when the low side transistors (118) are conductive.

System 101 may include other circuitry, devices, and/or signal paths (not shown) between the items of FIG. 1. Also, FIG. 1 may have other configurations in other embodiments.

Figure 2:
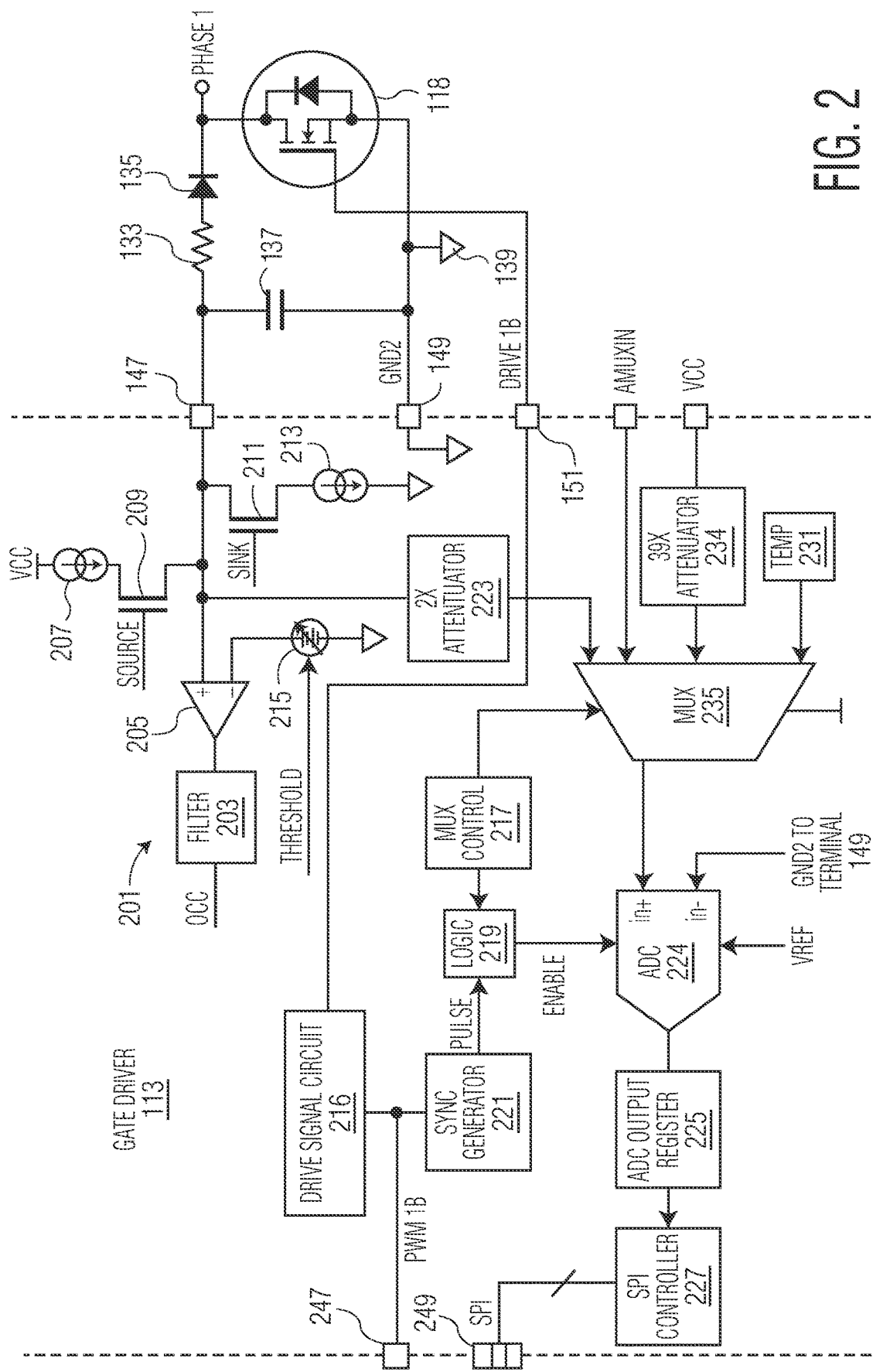
FIG. 2 is a circuit diagram of a portion of a gate control driver and transistor according to one embodiment of the present invention.

FIG. 2 is a circuit diagram of gate driver 113. Gate driver 113 includes an overcurrent detection circuit 201 for detecting an overcurrent condition with system 101. In one embodiment, an overcurrent detection condition would include a short circuit condition such as a short circuit of a phase winding of motor 102 or a short circuit of transistor 116.

Detection circuit 201 includes a current source 207 and an activation switch 209 (which is implemented with an NFET) for providing current to charge capacitor 137 during a detection operation. Circuit 201 includes a current source 213 and an activation switch 211 (which is implemented with an NFET) for discharging current from capacitor 137 after a detection operation. Circuit 201 includes a comparator 205 for comparing a voltage of terminal 147 with the voltage of variable voltage source 215 to determine whether an overcurrent condition exists. The voltage provided by variable voltage source 215 is set by a threshold value (THRESHOLD) that can be programed at power up by controller 103 via the SPI bus 144. Circuit 201 includes a filter 203 that filters out spurious readings due to momentary voltage spikes at terminal 147.

In one embodiment, circuit 201 checks for an overcurrent condition during a detection operation that occurs during an on phase of transistor 118 (when the DRIVE 1B signal is high to make transistor 118 conductive). At the beginning of the on phase, the SOURCE signal is asserted to activate switch 209 to provide a current from source 207 to charge capacitor 137. In one embodiment, capacitor 137 is utilized to suppress transilient currents for overcurrent detection. Because terminal 147 is coupled to the drain of transistor 118 by a current path that includes resistor 133 and diode 135, the voltage of terminal 147 rises to a value that is dependent upon the voltage of the drain-source voltage drop across transistor 118. If there is an overcurrent condition through the drain-source path of transistor 118 during an on phase of transistor 118, the drain-source voltage drop of transistor 118 will increase significantly above a threshold set by variable voltage source 215. If the overcurrent condition is more than just momentary, as determined by filter 203, then the OCC signal at the output of filter 203 will indicate an overcurrent condition. In response, controller 103 will be notified (e.g., either by the SPI data bus 144 or by another signal line (not shown)) of the overcurrent condition, wherein motor 102 maybe shut down to prevent damage to motor 102 and/or to system 101. An overcurrent detection circuit may have other configurations, other circuitry, and/or operate in other ways to detect an overcurrent condition in other embodiments.

It has been advantageously realized that a terminal (e.g., terminal 147) of an integrated circuit which is used to detect an overcurrent condition, can also be used to determine the internal temperature of the transistor coupled to the terminal. In some embodiments, the internal temperature can be determined from the current electrode-to-current electrode voltage drop of the transistor when conductive. With some transistors, the internal temperature of the transistor can be determined by determining the resistance between the current electrodes of the transistor (e.g., the drain and source of a FET) when the transistor is conductive (referred to as on resistance (RDSON) for a FET). An estimate of the on resistance can be determined from the current electrode-to-current electrode voltage drop of the transistor. Because overcurrent detection circuit 201 uses a terminal (147) that is coupled to the drain of transistor 118, a voltage reading of that terminal when the transistor is conductive can be used to determine the internal temperature of the transistor. In some embodiments, the voltage reading of a terminal (147) can be used in conjunction with the known phase current of a phase signal line (PHASE 1) when the transistor is conductive (e.g., from current sensor 150) to determine the RDSON of the transistor.

Gate driver 113 is configured to obtain a digital value that is indicative of the drain-source voltage of transistor 118. In the embodiment of FIG. 2, terminal 147 is coupled to the drain of transistor 118 and terminal 149 is coupled to the source of transistor 118 and to ground 139. Terminal 147 is connected to a voltage attenuator 223 of gate driver 113 that reduces the analog voltage of terminal 147 by a factor of 2 or more to clamp the voltage to the maximum rating of analog to digital converter (ADC) 224. In one embodiment, attenuator 223 is implemented with a voltage divider, but may be implemented with other circuitry and/or attenuate the voltage by other values in other embodiments. Some lower voltage systems may not utilize an attenuator.

The reduced voltage from attenuator 223 is provided to an input of multiplexer (MUX) 235. Multiplexer 235 has other inputs for receiving other analog signals such as an input coupled to auxiliary terminal 156, an input coupled to attenuator 234, which provides a 39× reduction in the voltage of VCC from an external power source, and an input coupled to a temperature sensor 231 that is internal to the integrated circuit of gate driver 113. Mux 235 may have other inputs as well.

When selected by mux control circuit 217, multiplexer 235 provides the attenuated voltage from attenuator 223 to an input of analog to digital converter (ADC) 224 which produces a digital representation of the voltage of terminal 147 which is indictive of the voltage across terminals 147 and 149. The other input of ADC 224 is connected to terminal 149 which is connected to ground 139. In one embodiment, MUX control circuit 217 sequentially selects the inputs of MUX 235 periodically to produce digital values of those inputs. In the embodiment shown, the digital outputs of ADC 224, including the digital representation of the voltage of terminal 147, are provided to ADC output register 225, where they can then be accessed by a bus controller (SPI controller 227) to be provide to system controller 103 or accessed by another circuitry (not shown) of gate driver 113. In one embodiment, the digital representation of the voltage of terminal 147 is provided to controller 103 via the SPI bus 144 which is connected to gate driver 113 at integrated circuit terminals 249. As will be described later, controller 103 calculates the internal temperature from the digital representation of the voltage of terminal 147 produced by ADC 224, which is an indication of the drain-source voltage of transistor 118.

In the embodiment shown, driver 113 includes a drive signal circuit 216 that switches the DRIVE 1B signal to a high voltage to make transistor 118 conductive to begin the on phase in response to a rising edge of the PWM 1B signal and switches the DRIVE1B signal to a low voltage to make transistor 118 nonconductive to begin the off phase in response to a falling edge of the PWM 1B signal.

Because a determination of an internal temperature is based on a measurement of the drain-source voltage of transistor 118 when transistor 118 is conductive (during an on phase), driver 113 includes circuitry to prevent ADC 224 from providing digital representations of the voltage of terminal 147 when transistor 118 is not conductive (during an off phase). In the embodiment shown, driver 113 includes a sync generator 221 that generates a synchronization pulse at its output (PULSE) at a programmable delayed time from the rising edge of the PWM 1B signal, wherein the pulse is only at a high value when transistor 118 is conductive. Driver 113 also includes a logic circuit 219 that provides an ENABLE signal to enable and disable ADC 224. In the embodiment shown, logic circuit 219 is configured to disable ADC 224 when the MUX control circuit 217 selects the MUX input coupled to attenuator 223 and the PULSE signal is low so that ADC 224 does not generate a digital representation of the voltage of terminal 147 at those times. When MUX control circuit 217 has selected the MUX input coupled to attenuator 223 and the PULSE signal is high, logic circuit 219 enables ADC 224 to provide a digital representation of the voltage of terminal 147, so as to ensure that the digital representation is taken only when transistor 118 is conductive. In the embodiment shown, ADC 224 is able to perform several digital approximations during the time period of the PWM 1B signal in that ADC 224 operates according to a clock signal (not shown) with a significantly higher frequency than that of the PWM 1B signal.

Other embodiments may have other configurations to ensure that ADC 224 only generates digital representations of the voltage of terminal 147 when transistor 118 is conductive. For example, in some embodiments, MUX control circuit 217 may receive the PULSE signal and only selects the MUX input coupled to attenuator 223 when the PULSE signal is high. In other embodiments, the sync generator 221 and logic circuit 219 may be integrated together and/or operate in other ways.

One advantage of providing circuitry that prevents ADC 224 from generating a digital representation of terminal 147 when transistor 118 is nonconductive is that it allows for ADC 224 to provide digital values of other parameters including when transistor 118 is nonconductive.

In other embodiments, gate driver 113 may include other circuitry (not shown). Also, gate driver 113 may have other configurations. In some embodiments, the gate drivers of system 101 may be integrated on the same integrated circuit as controller 103.

Figure 3:
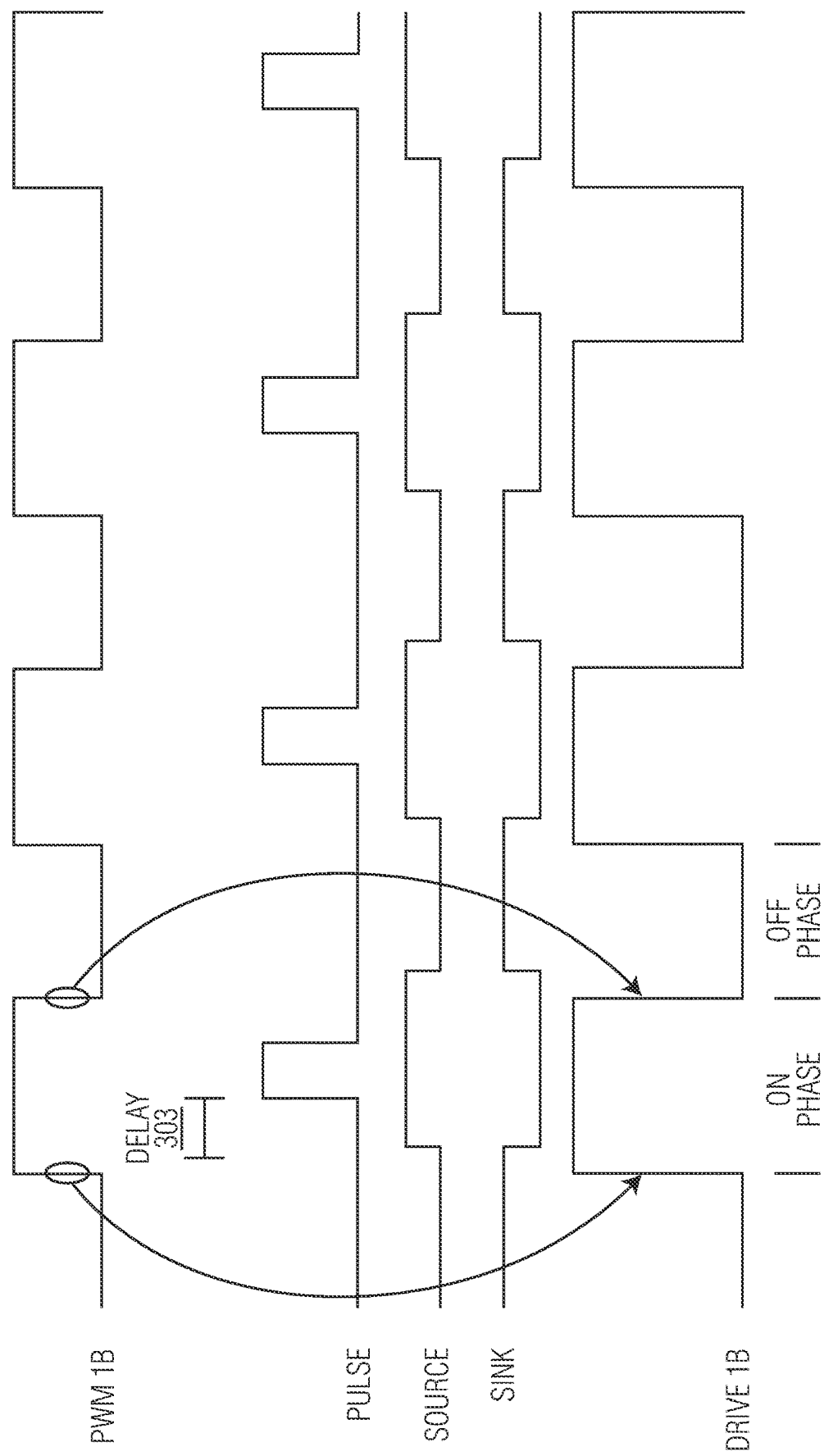
FIG. 3 is a timing diagram according to one embodiment of the present invention.

FIG. 3 is a timing diagram of signals generated and received by gate driver 113 according to one embodiment of the present invention. As shown in FIG. 3, the rising and falling edges of the drive signal DRIVE 1B produced by drive signal circuit 216 are controlled by the rising and falling edges of the PWM 1B signal provided by controller 103. Transistor 118 is conductive when the DRIVE 1B signal is at a high voltage value (defined as the "ON PHASE") and is nonconductive when the DRIVE 1B signal is at a low voltage value (defined as the "OFF PHASE"). The PULSE signal rises to a high voltage a delay time (delay 303) after the rising edge of the PWM 1B signal. When the PULSE signal is high, ADC circuit is enabled to generate a digital representation of the voltage of terminal 147 when MUX control circuit 217 selects the input coupled to attenuator 223 to be provided to the input of ADC 224. As shown in FIG. 3, the PULSE signal is only high during the ON phases. Accordingly, during each ON PHASE, ADC produces a digital representation of the voltage of terminal 147.

Also shown in FIG. 3 are the SOURCE and SINK signals. The SOURCE signal, when at a high voltage, is used to provide current produced by current source 207 to charge capacitor 137 to test for an overcurrent condition. The SINK signal, when at a high voltage is used to discharge capacitor 137 by current source 213 during an OFF phase so that the OCC signal will not indicate an overcurrent condition during this time. In the embodiment shown, the SOURCE signal is a delayed signal of the PWM 1B signal and the SINK signal is an inverted signal of the SOURCE signal. However, in other embodiments, the SOURCE signal may be a pulse signal that is delayed from the rising edge of the PWM 1B signal. In the embodiment shown, the SINK signal will be high for a short duration after PWM 1B goes high to discharge capacitor 137 and let transistor 118 become conductive. After this time, the SOURCE signal goes high and the SINK signal goes low to charge capacitor 137 and start the overcurrent detection operation before the generation of a digital value of the voltage of terminal 147.

Figure 4:
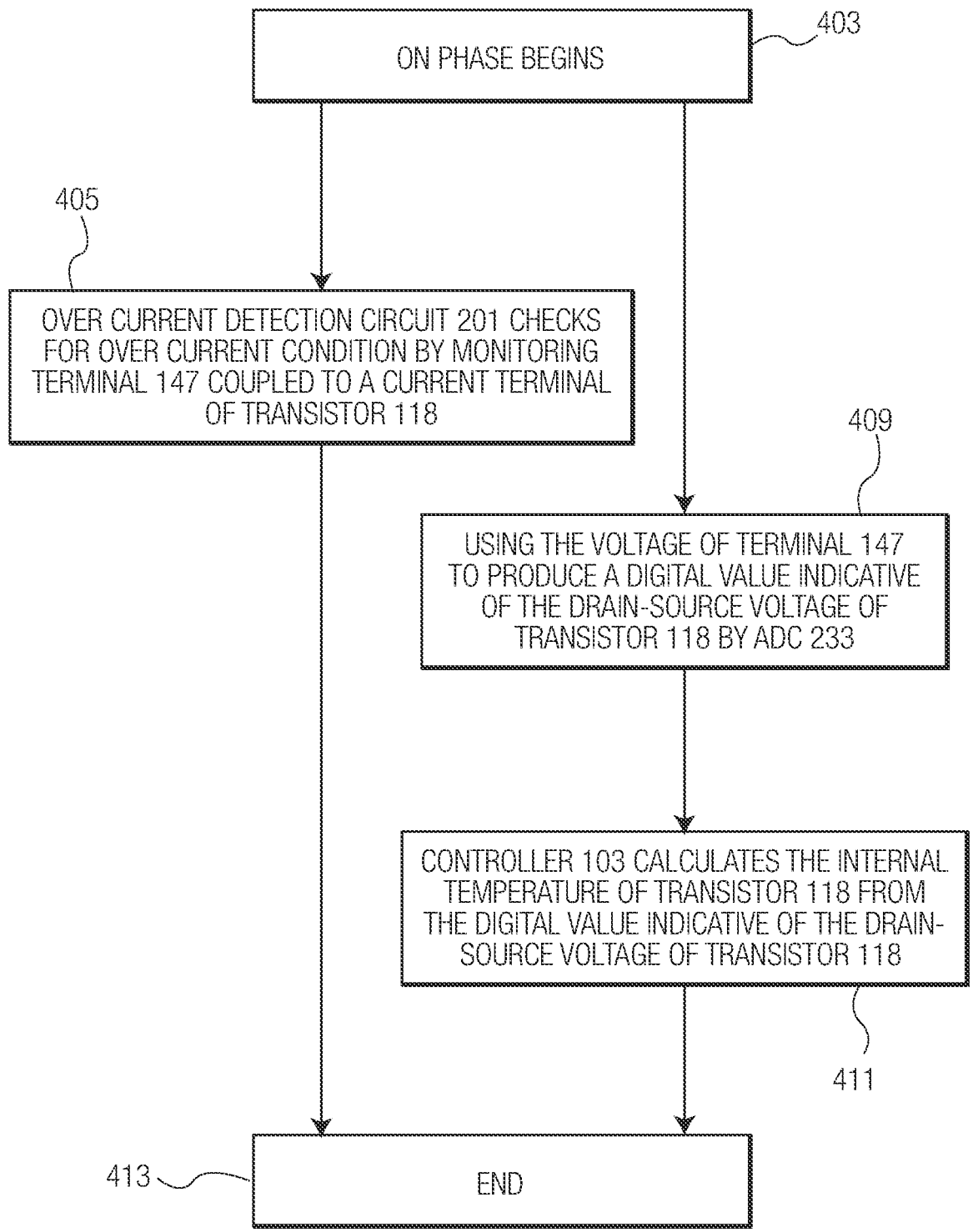
FIG. 4 is a flow chart showing an operation of the system of FIG. 1 according to an embodiment of the present invention.

FIG. 4 is a flow chart showing the operations of system 101 in determining an internal temperature of transistor 118 during an on phase of transistor 118 according to one embodiment. In FIG. 4, after the beginning of the on phase in operation 403 (when transistor 118 becomes conductive), the overcurrent detection circuit 201 checks for an overcurrent condition by monitoring terminal 147, which is coupled to transistor 118. Detection circuit 201 begins monitoring terminal 147 after the SOURCE signal is asserted to charge capacitor 137 (see FIG. 3).

Also, after the on phase begins in operation 403, the voltage of terminal 147 is used in the producing digital value indicative of the voltage of the drain-source voltage of transistor 118 by ADC 224 in operation 409. In one embodiment, ADC 224 produces the digital indication during the assertion of the PULSE signal by sync generator 221. The digital indication is provided to controller 103 via the SPI bus 144.

In operation 411, controller 103 calculates the internal temperature of transistor 118 using the digital value produced in operation 409.

In some embodiments, because the same terminal is being used for overcurrent detection, controller has to take into account the effects of devices (resistor 133 and diode 135) that are coupled to terminal 147 in determining the internal temperature of transistor 118. Accordingly, controller 103 has to subtract from the indicated voltage value of terminal 147, the voltage drop due to resistor 133 and diode 135. In some embodiments, these devices have a voltage drop that is dependent temperature.

To obtain a temperature value used to account for the temperature dependent voltage drop of resistor 133 and diode 135, MUX 235 periodically provides the output of internal temperature sensor 231 to ADC 224 to provide a digital value indicative of that temperature. That digital value is provided to controller 103 via SPI bus 144. In one embodiment, controller 103 then uses the temperature information from sensor 231 to access temperature dependent resistance information in memory 107 for resistor 133 and diode 135 to determine what portion of the measured voltage of terminal 147 to allocate to resistor 133 and diode 135. By subtracting out that portion from the measured voltage of terminal 147, controller 103 can then determine the RDSON of transistor 118, which can be correlated with an internal temperature of transistor 118. In one embodiment, the drain-source voltage of transistor 118 is equal to the digital value from ADC 224 times the attenuation factor of attenuator 223 minus the voltage drop of diode 135 and minus the voltage drop of resistor 133 (current from current source 207 times the resistance of resistor 133). The RDSON of transistor 118 can be determined by the drain-source voltage of transistor 118 divided by the phase current of the PHASE 1 signal line during an on phase of transistor 118 as provided by current sensor 150. The RDSON value (calculated with the formula above) can then be used to look up the internal temperature of transistor 118 in a table in memory 107. In other embodiments, the measured digital value indicative of the voltage of terminal 147 can be used in other ways to determine the internal temperature of transistor 118. For example, a table in memory 107 can incorporate some of the calculated values (e.g., the voltage drop of resistor 133) described above. In some embodiments, the table with the internal temperature values stored in memory 107 may be a multiple variable input table with variable inputs of the digital voltage, phase current, and ambient temperature.

In one embodiment, the method shown in FIG. 4 is repeated for every on phase of transistor 118. Accordingly, controller 103 continuously monitors the internal temperature of transistor 118 and checks for overcurrent conditions. In addition, controller 103 also performs the same method for the other five transistors (transistor 116 and the upper and lower transistors of phase 2 generator 115 and phase 3 generator 117) during each on phase of those transistors. Thus, controller 103 can continuously monitor for overcurrent and temperature issues of system 101 and motor 102 and can provide warnings or shut down motor 102 upon detection of such issues.

The circuitry, systems and methods described above may be further modified in other embodiments. For example, in some embodiments, each gate driver may include circuitry to calculate the internal temperature of its corresponding transistor. In some embodiments, the temperature sensor (e.g., sensor 231) used to provide an "ambient" temperature of the system may be located external to the integrated circuit of the gate driver. In some embodiments, such an "ambient" temperature sensor may be coupled to controller 103 where controller 103 uses the value taken from that sensor to determine the internal temperatures for all six transistors being monitored.

Although the internal temperature detection of a transistor is described above with respect to a variable frequency drive controller of an electric motor for a vehicle, such a system can be used in other applications that utilize a transistor e.g. in applications such as in trains, variable-speed refrigerators, lamp ballasts, arc-welding machines, power supplies, air conditioners, transmitters, or in any other application where the monitoring of an internal temperature of a transistor may be useful, including applications where there is a greater or lesser number of transistors being monitored.

In some embodiments, using the voltage of a terminal to monitor internal temperature that is also used to monitor overcurrent conditions, may provide for a simplified transistor control system that can be implemented with fewer devices and/or include a lesser number of integrated circuit terminals. For example, some prior art motor control systems include a separate analog to digital converter that is external to the gate driver integrated circuit, wherein the external ADC is coupled to the current electrodes of the transistor being monitored to determine internal temperature. Such a prior art system would require at least one additional integrated circuit terminal to receive the measured results as well as an isolated, external ADC, an external differential amplifier, and external clamping diodes. Furthermore, enabling the use of an ADC for internal temperature monitoring that is also used to provide digital values of other parameters may allow for the simplification of circuitry in communicating data to an external controller (e.g., 103) such as for example, through a common digital bus (e.g., SPI bus 144).

Features described herein with respect to one embodiment may be implemented in other embodiments described herein. A current electrode of a FET (field effect transistor) is a source or drain. A control electrode of a FET is a gate. A current electrode of a bipolar transistor is an emitter or a collector. A control electrode of a bipolar transistor is a base. With some IGBTs, a current electrode is the collector or emitter and a control electrode is a gate. A terminal of an integrated circuit is a conductive structure generally located on an outer surface of the integrated circuit that provides for signals or power to be received and/or provided to devices external form circuitry internal to the integrated circuit. Examples of integrated circuit terminals includes pads, posts, or bumps. Integrated circuits may be packaged in integrated circuit packages that are implemented in integrated systems.

In one embodiment, a method includes checking by an overcurrent detection circuit of an integrated circuit for an overcurrent condition by monitoring a first terminal of the integrated circuit. The first terminal is coupled to a current electrode of a transistor. The method includes, during an on phase of the transistor, using a voltage of the first terminal in producing a digital value by an analog to digital converter. The digital value indicative of a current electrode to current electrode voltage of the transistor. The method includes calculating by circuitry, an internal temperature of the transistor from the digital value.

In one embodiment, an integrated circuit includes a first terminal configured to sense a voltage and an overcurrent detection circuit including an input coupled to the first terminal. The overcurrent detection circuit configured to provide an indication of an overcurrent condition relating to the first terminal. The integrated circuit includes an analog to digital converter including an input to receive analog voltages and an output to provide digital representations of the analog voltages. The integrated circuit includes a multiplexer having an output coupled to the input of the analog to digital converter. The integrated circuit includes a first input of the multiplexer coupled to receive an analog indication of a voltage of the first terminal. The integrated circuit includes a second terminal for providing a pulse width modulated signal that defines alternating on phases and off phases. The analog to digital converter provides a digital representation of the voltage of the first terminal during an on phase and does not provide a digital representation of the voltage of the first terminal during an off phase.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method comprising:
    checking by an overcurrent detection circuit of an integrated circuit for an overcurrent condition by monitoring a first terminal of the integrated circuit, wherein the first terminal is coupled to a current electrode of a transistor;
    during an on phase of the transistor, using a voltage of the first terminal in producing a digital value by an analog to digital converter, the digital value indicative of a current electrode to current electrode voltage of the transistor;
    calculating by circuitry, an internal temperature of the transistor from the digital value.

2. The method of claim 1, wherein first terminal is coupled to the current electrode of the transistor through a current path, wherein a diode is located in the current path, wherein the digital value is indicative of a voltage drop across the diode, wherein the calculating the internal temperature includes adjusting a voltage indicated by the digital value to account for the voltage drop across the diode.

3. The method of claim 2 wherein the calculating includes using a measurement of a temperature of a temperature sensor in the adjusting the voltage.

4. The method of claim 1 further comprising:
    enabling a current source to provide current to the first terminal at least during a portion of the on phase.

5. The method of claim 4 further comprising:
    enabling a second current source to sink current from the first terminal at least during a portion of when the transistor is in an off phase, wherein the enabling of the current source and the enabling of the second current source are each based on a timing of the on phases the transistor.

6. The method of claim 1 further comprising:
    attenuating the voltage of the first terminal prior to producing the digital value.

7. The method of claim 1 wherein the analog to digital converter includes an input coupled to a multiplexer, wherein the producing includes selecting an input of the multiplexer to provide to the input of the analog to digital circuit a voltage indicative of the voltage of the first terminal.

8. The method of claim 1 wherein the current electrode of the transistor is coupled to a path, wherein the method further comprises measuring a current of the path during the on phase of the transistor, wherein the circuitry utilizes an indication of the measured current in calculating the internal temperature of the transistor.

9. The method of claim 1 further comprising:
    measuring a temperature provided by a temperature sensor, wherein the circuitry utilizes a digital indication of the measured temperature in calculating the internal temperature of the transistor.

10. The method of claim 1 further comprising:
    inhibiting the analog to digital convertor from producing a digital value indicative of a current electrode to current electrode voltage of the transistor when the transistor is not conductive.

11. The method of claim 1 wherein the producing a digital representation is performed at least after a delay time from a changing of an external pulse width modulated signal indicating that the transistor should transition to the on phase.

12. The method of claim 1 wherein the integrated circuit includes a second terminal, the method includes producing a gate drive signal at the second terminal, wherein the gate drive signal is a pulse width modulated signal that defines on phases and off phases of the transistor.

13. The method of claim 12 wherein the gate drive signal is produced by a drive signal circuit of the integrated circuit, wherein a timing of changes of states of the gate drive signal is controlled by a pulse width modulated control signal from a second integrated circuit.

14. The method of claim 13 wherein the second integrated circuit includes the circuitry that performs the calculating.

15. The method of claim 1 wherein the current electrode of the transistor is coupled to a path to provide current to a motor winding of an electric motor.

16. The method of claim 15 wherein the circuitry calculates the internal temperature of five other transistors, wherein each of the five other transistors includes a current electrode that is coupled to a winding of the electric motor.

17. The method of claim 1, wherein first terminal is coupled to the current electrode of the transistor through a current path, wherein a resistive element is located in the current path, wherein the digital value is indicative of a voltage drop across the resistive element, wherein the calculating the internal temperature includes adjusting a voltage indicated by the digital value to account for the voltage drop across the resistive element.

18. The integrated circuit of claim 17 further comprising:
a third terminal to receive a pulse width modulated control signal, wherein a timing of occurrence of the on phases and off phases are controlled by the pulse width modulated control signal.

19. The integrated circuit of claim 17 further comprising:
a set of at least one terminal, wherein the integrated circuit is configured to provide a digital representation of the voltage of the first terminal externally via the set of at least one terminal.

20. An integrated circuit comprising:
a first terminal configured to sense a voltage;
an overcurrent detection circuit including an input coupled to the first terminal, the overcurrent detection circuit configured to provide an indication of an overcurrent condition relating to the first terminal;
an analog to digital converter including an input to receive analog voltages and an output to provide digital representations of the analog voltages;
a multiplexer having an output coupled to the input of the analog to digital converter;
a first input of the multiplexer coupled to receive an analog indication of a voltage of the first terminal;
a second terminal for providing a pulse width modulated signal that defines alternating on phases and off phases;
wherein the analog to digital converter provides a digital representation of the voltage of the first terminal during an on phase and does not provide a digital representation of the voltage of the first terminal during an off phase.

* * * * *